(12) United States Patent
Gao

(10) Patent No.: US 11,744,048 B2
(45) Date of Patent: Aug. 29, 2023

(54) FLUID CONNECTION MODULE WITH ADVANCED FLUID SWITCHING UNIT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 91 days.

(21) Appl. No.: 17/463,590

(22) Filed: Sep. 1, 2021

(65) Prior Publication Data

US 2023/0064284 A1 Mar. 2, 2023

(51) Int. Cl.
*H05K 7/20* (2006.01)

(52) U.S. Cl.
CPC ..... *H05K 7/20836* (2013.01); *H05K 7/20272* (2013.01); *H05K 7/20781* (2013.01)

(58) Field of Classification Search
CPC .......... H05K 7/20836; H05K 7/20272; H05K 7/20781
See application file for complete search history.

*Primary Examiner* — Emmanuel E Duke
(74) *Attorney, Agent, or Firm* — WOMBLE BOND DICKINSON (US) LLP

(57) ABSTRACT

Embodiments are disclosed of a fluid connection module. The module includes a holder coupled to a connector having an axis, and the holder is translatable in both directions of the axis so that the holder and the connector can translate between an engaged and disengaged positions. The holder is biased toward the disengaged position. A switching unit adjacent to the holder includes an electric motor. A blade is coupled to the electric motor and is rotatable through a range of angular positions. The blade has a contact surface that contacts a bearing surface of the holder in a first subrange of angular positions and stops contacting the bearing surface in a second subrange of angular positions. When the contact surface is in contact with the bearing surface, the holder is in its engaged position. An elastic torque member is coupled to the motor and the blade and biases the blade to an angular position in the second subrange.

20 Claims, 10 Drawing Sheets

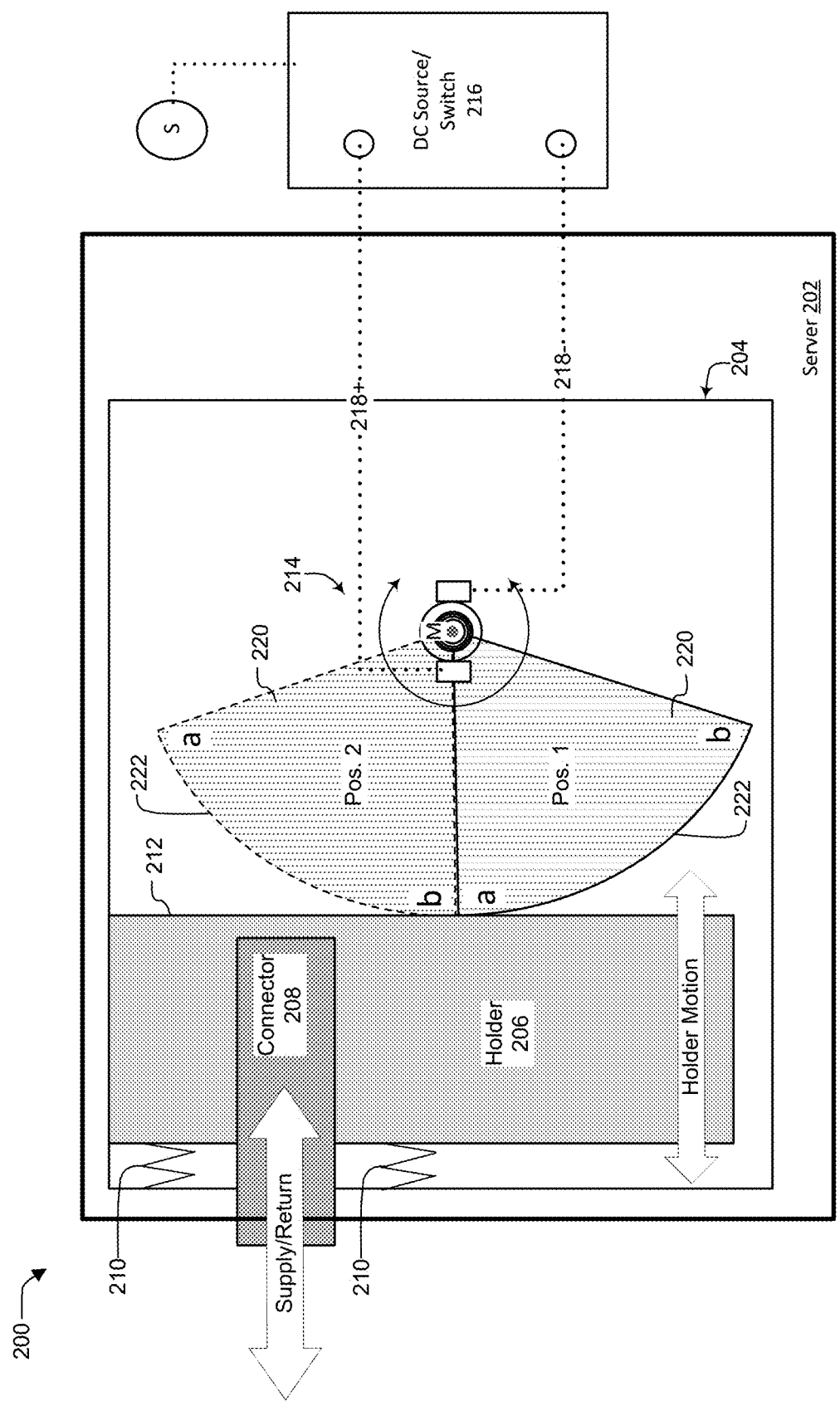

FLUID CONNECTION MODULE WITH ADVANCED FLUID SWITCHING UNIT

TECHNICAL FIELD

The disclosed embodiments relate generally to information technology (IT) liquid cooling systems, but not exclusively, to a switching unit used for regulating flow in a liquid cooling system.

BACKGROUND

Modern data centers like cloud computing centers house enormous amounts of information technology (IT) equipment: servers, blade servers, routers, edge servers, power supply units (PSUs), battery backup units (BBUs), etc. These individual pieces of IT equipment are typically housed in racks within the computing center, with multiple pieces of IT equipment in each rack, and the racks commonly grouped into clusters.

As IT equipment has become more computationally powerful it also consumes more electricity and, as a result, generates more heat. This heat must be removed to keep the equipment operating properly. To keep up with this increasing need for heat removal, IT equipment has incorporated internal liquid cooling systems and, at the same time, the IT racks in which IT equipment is housed have incorporated rack-level liquid cooling systems that interface with the internal liquid cooling systems of the IT equipment.

One problem with current server liquid cooling and rack-level liquid cooling systems is that they can leak, potentially causing damage to themselves, to the IT equipment to which they are coupled, and to other IT equipment housed in the same rack. Leakage can not only impact the service, but it can also cause damage to expensive electronics. Designing a liquid cooling system that eliminates the single failure point is challenging; simple changes, such as adding fluid distribution components to the rack, might not function properly because such rack-level changes often require corresponding changes in the IT equipment—changes that can only be made effectively by designing the rack and IT equipment together. And existing solutions may not provide mature solutions for responding to incidents of fluid leakage.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2A-2B are plan views of a fluid connection module with an embodiment of a fluid switching unit.

DETAILED DESCRIPTION

Figure 1:
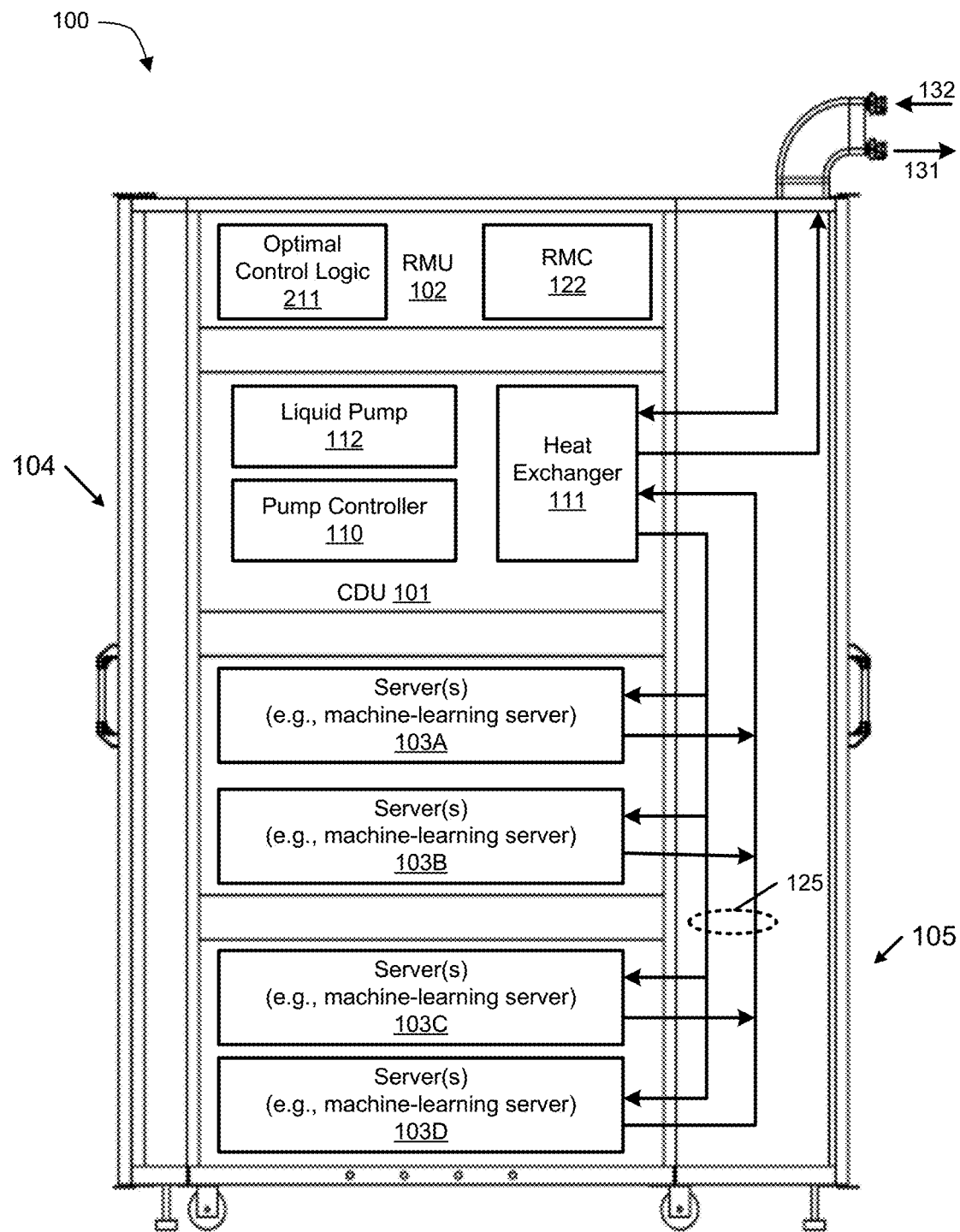
FIG. 1 is a side view of an embodiment of a liquid-cooled information technology (IT) rack populated with various pieces of IT equipment.

Embodiments are described of a fluid connection module for use with a piece of information technology (IT) equipment such as a server in an IT rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

The disclosed embodiments relate to cloud and edge computing equipment, electronic systems, and other systems that are thermally managed by liquid cooling solutions. The embodiments enable a liquid cooling system to empty the liquid from the cooling module in certain failure scenarios. This feature is useful to increase the overall system reliability and robustness of liquid-cooled IT equipment. One of the feasible means is to enable asynchronous fluid supply and return management. In addition, several challenges addressed by the described embodiments include:

System response and fluid management during fluid leakage scenarios.

System and module design for liquid cooling to increase reliability.

Hardware solution for eliminating fluid leakage impact.

Support hyperscale deployment, as well as edge use cases.

Critical requirement from cloud and edge servers.

Accommodate different server architectures.

Accommodate different deployment scenarios.

Interconnection with power systems, this means it compatible with the power side operation sequence in a leakage scenario.

Commonly interface design, including power interface and control interface.

Interoperable solution, this is to decrease additional customization to compatible with different requirement.

Flexible solutions which can be used to adjust different time difference between supply and return.

Existing solutions may not provide for responding to incidents of fluid leakage. Some solutions attempt to cut off the fluid system with no additional action form the server side. The described embodiments provide an advanced hardware design for use in fluid connection modules. The solution provides a highly efficient hardware design and enables cost reduction. In addition, the solution may easily be used for different hardware platforms.

The described embodiments include an advanced fluid connection module. The module includes a holder for assembling the connectors, and an elastic structure is attached on one side of the holder. A fluid switching unit is used within the module. In one embodiment, the switching unit includes a blade with a curved shape such as a sector. The switching unit is operated with a motor and there are two separate blades: one for the supply connector and another for the return connector. During operation, when the motor is powered up by a DC source/switch, the switching unit is in the active (i.e., engaged) position and the fluid connectors are engaged (e.g., mating with rack connectors. But when the DC power source is cut off, the switching unit returns back to the idle (i.e., disengaged) position, with different blades taking different times to move from active to idle—a feature enabled by different blade characteristics such as blade angle and sector areas.

FIG. 1 is a block diagram illustrating a side view of an embodiment of an information technology (IT) rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a fluid connection module, such as the ones shown in FIG. 2 et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit. The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2B:
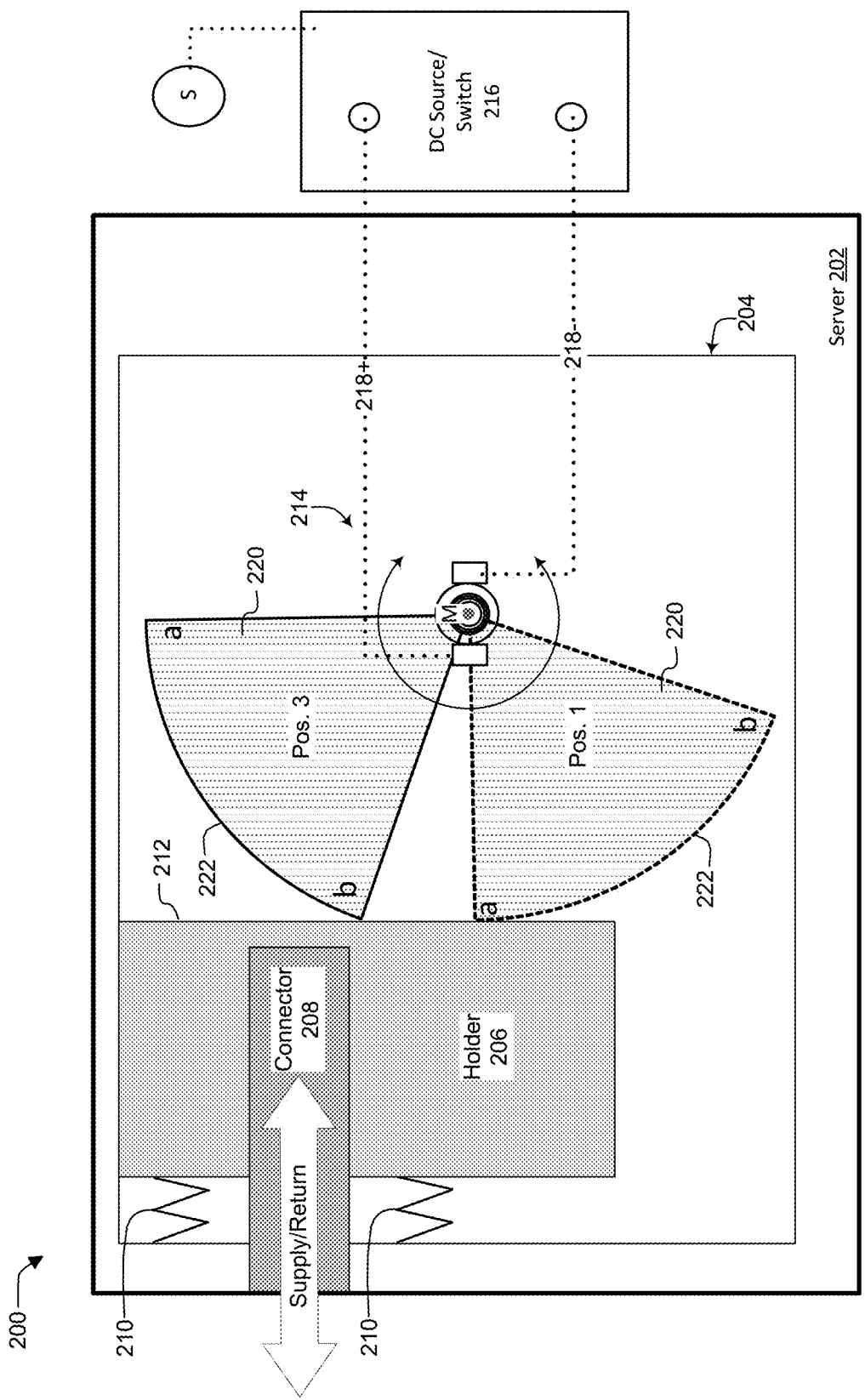

FIGS. 2A-2B or plan views that together illustrate an embodiment of a system 200 that includes a fluid connection module 204 positioned within a server 202. Fluid connection module 204 is used to control the flow of cooling fluid into and out of server 202, so that the cooling fluid can cool heat-generating components such as central processing units (CPUs), graphics processing units (GPUs), and other components (not shown) within server 202. In the illustrated embodiment, fluid connection module 204 is integrated within the chassis of server 202, but the space used by fluid connection module 204 in server 202 is shown for illustration purposes only and does not necessarily represent an actual product Fluid connection module 204 includes a holder 206 that is coupled to a fluid connector 208 and is used to support the fluid connector. In one embodiment, connector 208 can be embedded within holder 206, but in other embodiments connector 208 can be coupled to holder 206 in other ways. Fluid connector 208 can be a supply connector through which cooling fluid enters the server or a return connector through which cooling fluid leaves the server, and the fluid connector 28 is used to fluidly couple server 202 a mating fluid supply fluid return connector outside the server, for instance in an IT rack in which the server 202 is housed (see, e.g., FIG. 1). For clarity, fluid connections between connector 208 and heat-generating components within server 202 are not shown, but typically there will be fluid connections between connector 208 and any liquid-cooled heat-generating components that are being cooled by cooling fluid entering or leaving the server through connector 208.

Holder 206 can translate in at least two directions (left and right in the illustrated embodiment, as indicated by the two-headed arrow in the figure). Because connector 208 is coupled to holder 206, motion of holder 206 results in a corresponding motion of connector 208. In the illustrated embodiment, motion of holder 206 to the left extends connector 208 so that it can engage with an external fluid coupling, and motion of holder 206 to the right retracts connector 208 so that it can disengage from an external fluid coupling. An elastic member 210 biases holder 206, and thus connector 208, to its disengaged position. In the illustrated embodiment elastic member 210 includes a pair of linear springs, but in other embodiments other kinds of elastic members can be used to bias holder 206 toward its disengaged position.

A switching unit 214 is used to move holder 206 back and forth between its engaged and disengaged positions. Switching unit 214 includes an electric motor M coupled to a power source such as a DC source/switch 216 by a pair of electrical lines 218+ and 218−. DC source/switch 216 can also be communicatively coupled to one or more leak-detection sensors S. A sector-shaped blade 220 is coupled to motor M and to an elastic member (see FIG. 3 and associated discussion below). Blade 220 can rotate in both directions about an axis of motor M, as indicated by the circular arrow: the motor rotates the blade in one direction over an angular range (i.e., a range of angles), while the elastic member rotates the blade in the other direction over the angular range. In the illustrated embodiment, motor M rotates the blade counterclockwise and the elastic member rotates the blade clockwise Blade 220 includes a contact surface 222. In a first subrange of angular positions of the blade, contact surface 222 will be in contact with a bearing surface 212 of holder 206 and in a second subrange of angular positions of the blade contact surface 222 will not be in contact with bearing surface 212. Generally, when contact surface 222 is in contact with bearing surface 212 (i.e., in the first subrange) holder 206 will be pushed against elastic members 210 into its engaged position, and when contact surface 222 is not in contact with bearing surface 212 (i.e. in the second subrange) holder 206 will be pushed by elastic members 210 to its disengaged position. Further details of switching unit 214 are discussed below in connection with FIG. 3.

Operation of fluid connection module 204 is illustrated by FIGS. 2A-2B together. As shown in FIG. 2A, blade 220 starts in position 1, with corner a, and hence contact surface 222, in contact with bearing surface 212. When blade contact surface 222 is in contact with bearing surface 212, as it is in position 1, holder 206 is pushed against elastic members 210 into its engaged position. If power is cut off to electric motor M, either because the DC source fails or the switch in DC source/switch 216 is activated, the elastic member begins to rotate blade 220 clockwise from position 1 to position 2, where corner b, and hence contact surface 222, remains in contact with bearing surface 212; in position 2, then, holder 206 remains in its engaged position.

However as shown in FIG. 2B, as blade 220 continues to rotate clockwise, contact surface 222 loses contact with bearing surface 212. At that point blade 220 no longer exerts a force on holder 206 that overcomes the force exerted by elastic member 210, so that elastic member 210 pushes holder 206 from its engaged position to its disengaged position, thus disengaging fluid connector 208 and cutting off fluid flowing through it. Put differently, when blade 220 is in position 1, with the radius associated with corner "a" oriented horizontally as shown in the figure, contact surface 222 is in contact with bearing surface 212 and holder 206 is in its engaged position. As the blade rotates clockwise, from position 1 to position 2, contact surface 222 remains in contact with bearing surface 212 until surface 222 and corner "b" are positioned at the bearing surface—i.e., when the radius associated with corner "b" is horizontal in the figure. As the blade continues to rotate clockwise toward position 3, the radius associated with corner "b" passes the point where it is horizontal in the figure, and holder 206 and connector 208 start to disengage, and the holder and connector disengage further as the blade continues to rotate. Note that bearing surface 212 and corner "b" can remain in contact with each other while the connectors are disengaged.

When power is applied or restored to motor M, the opposite sequence occurs—i.e., the blade is rotated by motor M counterclockwise from position 3 to position 1. As the blade rotates, when it reaches position 2 contact surface 222 comes into contact with bearing surface 212. From position 2 until position 1, contact surface 222 exerts a force on holder 206 that overcomes the biasing force of elastic members 210, thus pushing holder 206 and connector 208 to their engaged position where fluid can again flow through connector 208. Motor M then holds position 1 until power to the motor is cut off.

Figure 3:
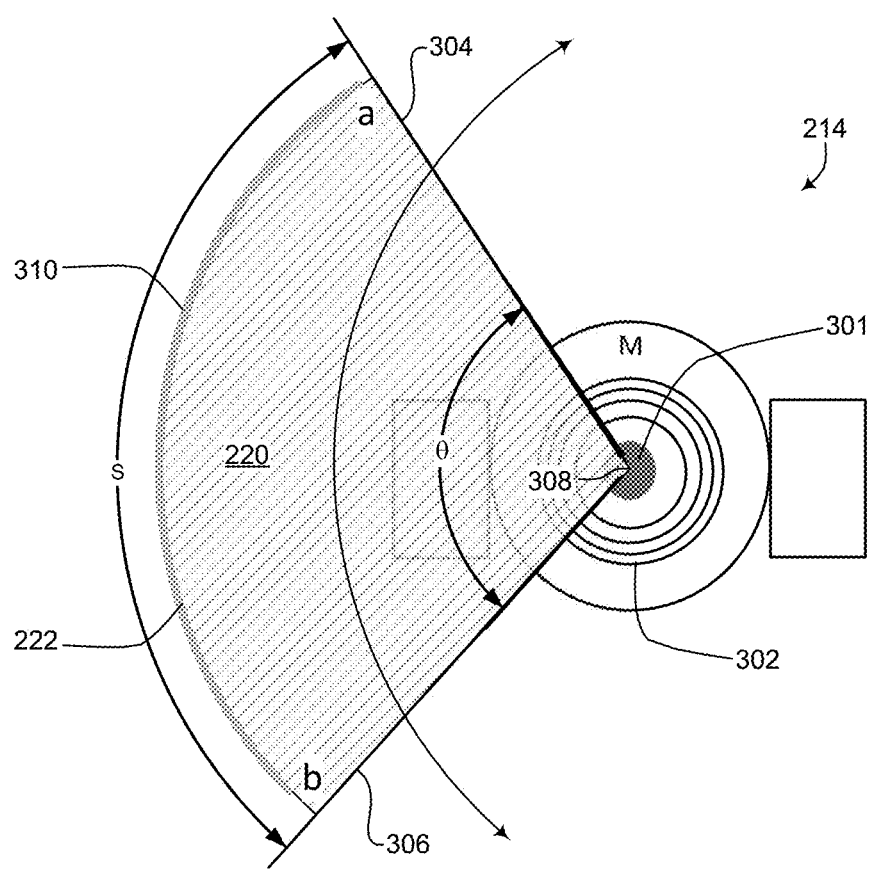
FIG. 3 is a plan view of an embodiment of a fluid switching unit such as the one used in the fluid connection module of FIGS. 2A-2B.

FIG. 3 illustrates an embodiment of a switching unit 214. Switching unit 214 includes three main components: a blade 220, an electric motor M, and an elastic member 302.

Blade 220 is sector-shaped—that is, shaped like a slice of pizza or pie. Mathematically, a sector is defined as the portion of a disk (a closed region bounded by a shape such as a circle) enclosed by two radii and an arc. In blade 220, then, the blade is defined by first radius 304, second radius 306, and an arc-shaped contact surface 222 with arc length S. In some embodiments, contact surface 222 can include a friction-reducing coating 310 to make it easier for the contact surface to slide relative to another surface with which it is in contact (see, e.g., FIGS. 2A-2B). In other embodiment, rotating ball bearings can be added to surface of 222. First radius 304 and second radius 306 subtend a blade angle $\theta$ where they intersect at vertex 308 of the blade. For a circle, blade angle $\theta$ and arc length S are linearly related: the larger blade angle $\theta$, the larger arc length S according to the equation $S=r\theta$, where r is the radius and $\theta$ is the blade angle measured in radians. The region where radius 304 intersects contact surface 222 is designated as "corner" a, while the region where radius 306 intersects contact surface 222 is designated as corner b, as also shown in other figures (see, e.g., FIGS. 2A-2B). The design and selection of the r and $\theta$ may accommodate different fluid disconnection operation requirements.

Blade 220 is coupled at or near vertex 308 to electric motor M, for instance by a motor shaft 301, so that the electric motor can rotate the blade. Elastic member 302 is coupled to blade 220 or shaft 301 in such a way that it can also rotate the blade. In one embodiment, elastic member 302 can be attached directly to blade 220 and to a fixed point, such as the housing of motor M, but in other embodiments the elastic member can be coupled to the motor shaft and to some fixed point inside or outside motor M. Motor M can be any electric motor that fits the size and power requirements for a given application, preferably one with high reliability (i.e., low mean time between failures (MTBF)). In one embodiment, elastic member 302 is a torsional spring, but in other embodiments it can be a different type of elastic member.

Both motor M and elastic member 302 can rotate the blade: motor M rotates the blade in one direction and the elastic member rotates the blade in the opposite direction, as illustrated by the two-headed circular arrow in the figure. In the illustrated embodiment, for instance, motor M can rotate the blade counterclockwise and the elastic member 302 can rotate the blade clockwise, but in other embodiments these directions can be reversed. In operation, elastic member 302 provides a torque that biases and can turn the blade in a first angular direction (clockwise in the illustrated embodiment). Motor M, when activated, applies a torque that counters the biasing torque of the elastic member to rotate the blade in a second angular direction opposite to the first (counterclockwise in the illustrated embodiment). When motor M is then deactivated (e.g., power to it is cut off), it no longer applies a torque to counter the elastic member's biasing torque, so the elastic member rotates the blade back in the first direction.

Figure 4A:
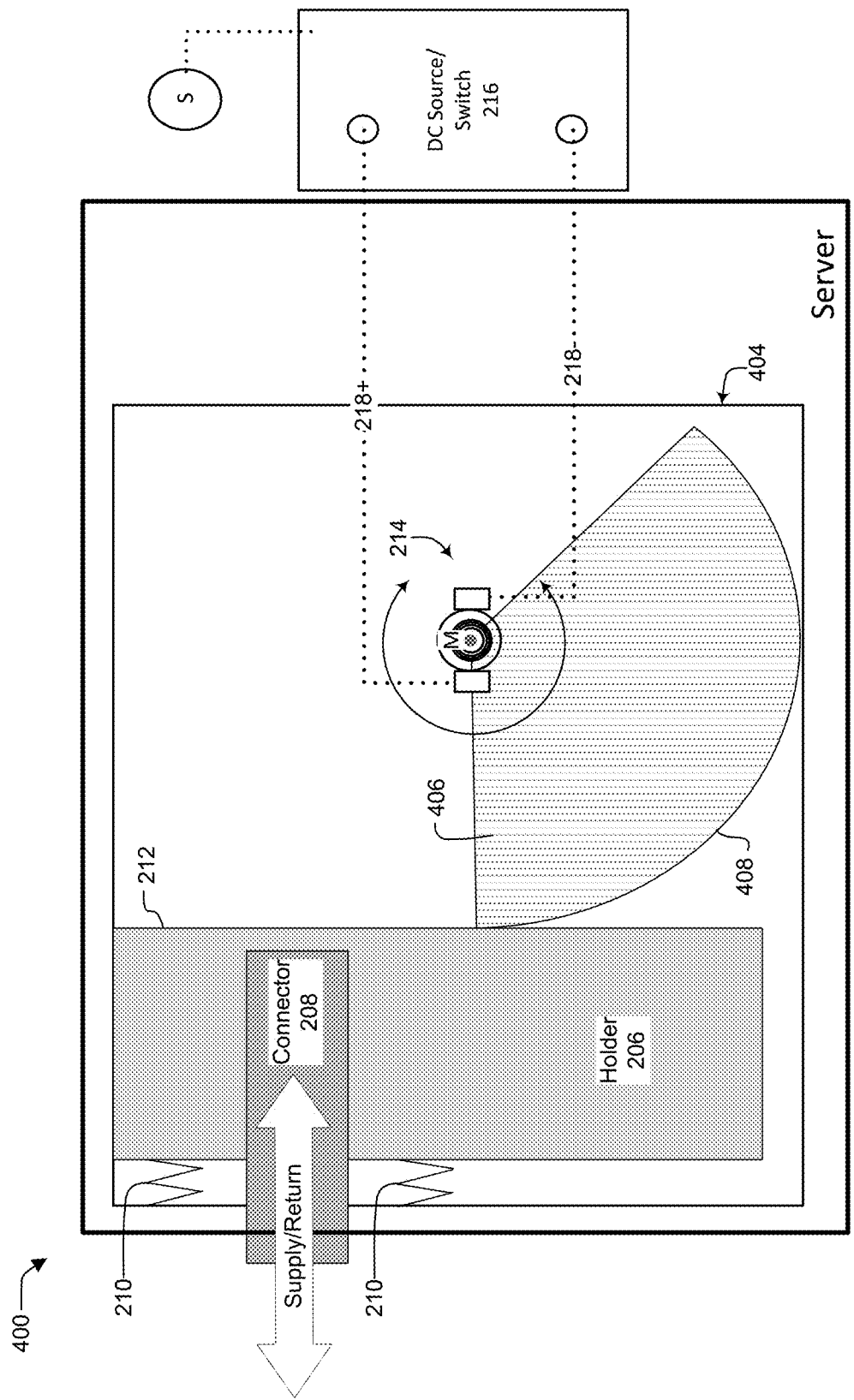
FIGS. 4A-4B are plan views of fluid connection modules with other embodiments of fluid switching units.
Figure 4B:
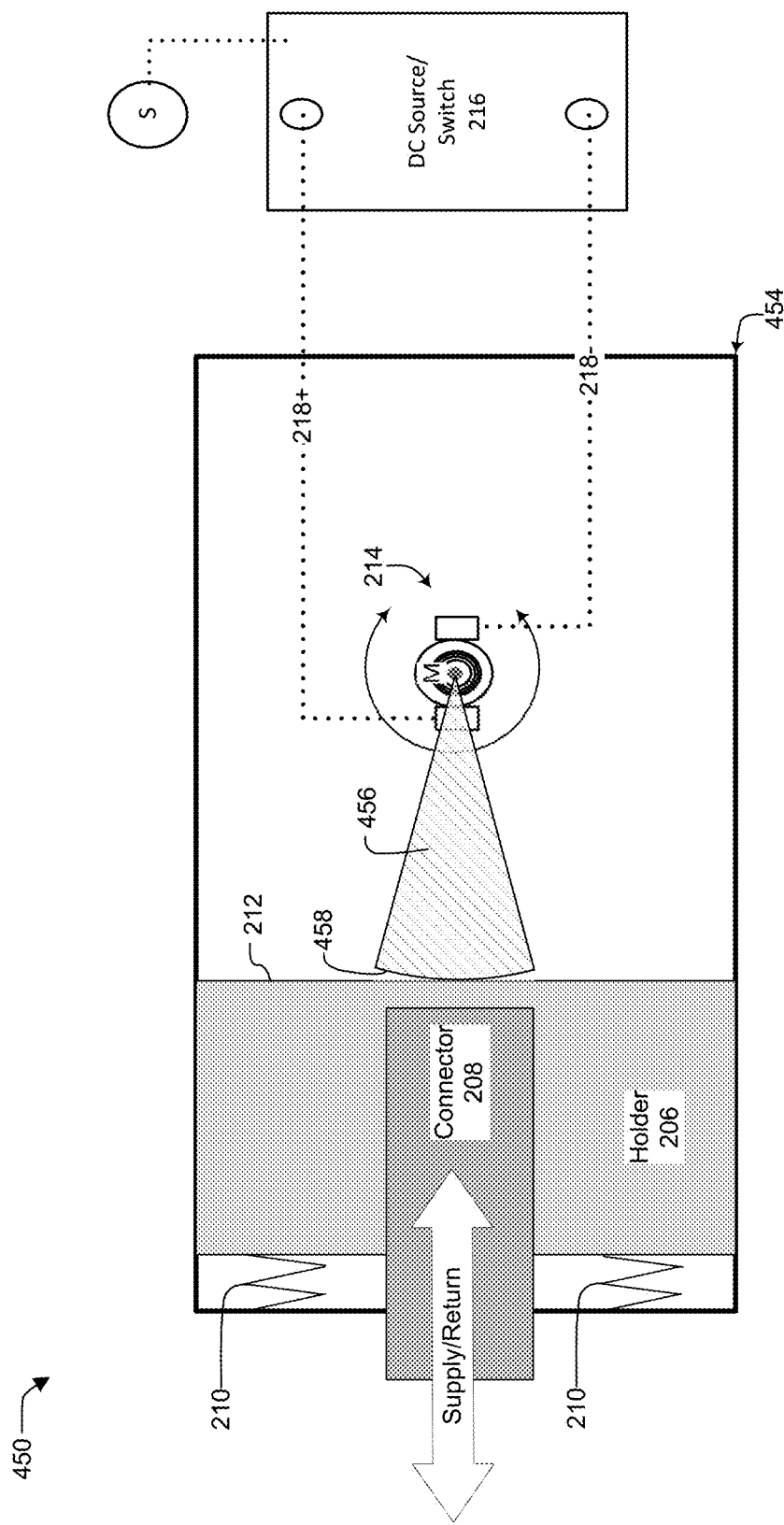

FIGS. 4A-4B illustrate embodiments of fluid connection modules with different blades. In some scenarios it can be desirable to control the amount of time it takes to disengage a fluid connector 208. For instance, in some applications that have separate connectors 208 for supply and return, it can be desirable to first disconnect the supply connector and then, after a delay, disconnect the return connector. FIGS. 4A-4B illustrate how the blade configuration can be used to accomplish this.

FIG. 4A illustrates a system 400 including a fluid connection module 404. Fluid connection module 404 is similar in most respects for fluid connection module 204 (see FIGS. 2A-2B): it includes holder 206, connector 208, elastic member 210, switching unit 214, and so on (see FIG. 3). The primary difference between fluid connection modules 404 and 204 is that in fluid connection module 404 switching unit 214 has a blade 406 with a substantially larger blade angle θ, as a result of which blade 406 has a contact surface 408 with a substantially larger arc length S. Because of its larger arc length, for a given rotation speed, whether applied by motor M or elastic member 302, surface 408 will remain in contact with bearing surface 212 for a longer time. When connector 208 is being disengaged, that means that in fluid connection module 404 switching unit 214 disengages connector 208 more slowly than in fluid connection module 204.

FIG. 4B illustrates a system 450 including a fluid connection module 454. Fluid connection module 454 is similar in most respects for fluid connection module 404: it includes holder 206, connector 208, elastic members 210, switching unit 214, and so on (see FIG. 3). The primary difference between fluid connection modules 454 and 404 is that in fluid connection module 454 switching unit 214 has a blade 456 with a substantially smaller blade angle θ, as a result of which blade 456 has a contact surface 458 with a substantially shorter arc length S. Because of its shorter arc length, for a given rotation speed, whether applied by motor M or elastic member 302, contact surface 458 will remain in contact with bearing surface 212 for a shorter time. When connector 208 is being disengaged, that means that in fluid connection module 454 switching unit 214 disengages connector 208 more quickly than in fluid connection modules 204 or 404.

Figure 5A:
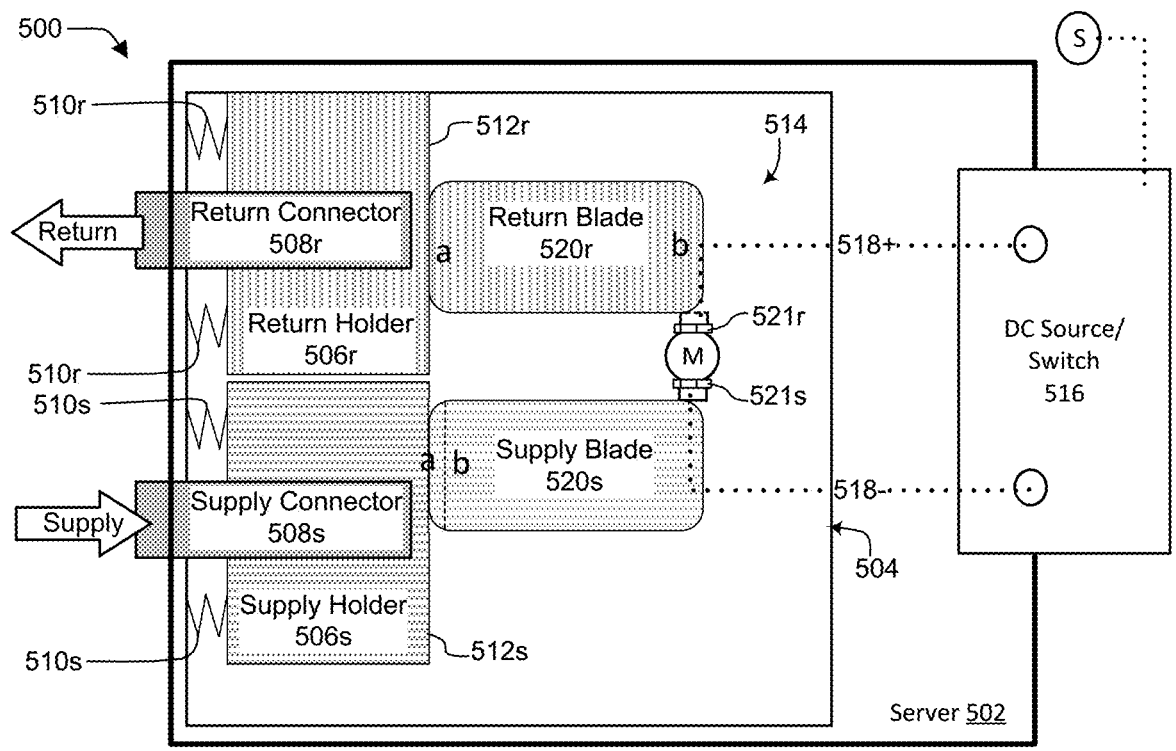
FIGS. 5A-5B are a plan view and a side view, respectively, of an embodiment of a fluid connection module with a multi-blade fluid switching unit.
Figure 5B:
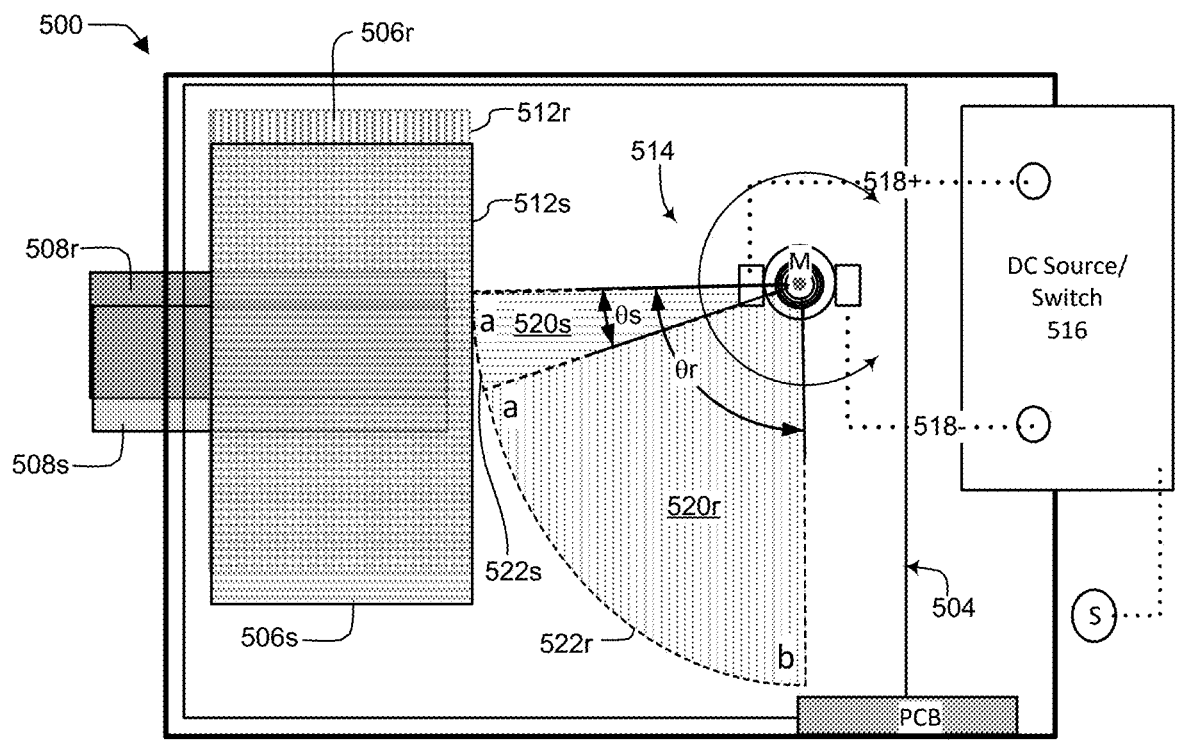

FIGS. 5A-5B together illustrate an embodiment of a system 500 with a multi-blade fluid connection module 502. FIG. 5A is a plan view, FIG. 5B a side view. In this embodiment, then, the blades are vertically oriented or as in previous embodiments they are horizontally oriented. In applications with separate supply and return connectors, if there is a fluid leak it can be desirable to disconnect the connectors asynchronously—e.g., to first disconnect the supply connector and then, after a delay, disconnect the return connector. This immediately cuts off the supply of cooling fluid to the server while leaving the cooling fluid return open for a short time to allow cooling fluid to drain out of the system, thus minimizing leakage. FIGS. 5A-5B illustrate how a multi-blade configuration can be used to accomplish this.

Fluid connection module 504 includes a supply holder 506s coupled to a supply connector 508s and a return holder 506r coupled to a return connector 508r. As in system 200, holders 506s and 506r are used to support their respective fluid connectors. In one embodiment, connectors 508s and 508r can be embedded within their holders, but in other embodiments the connectors can be coupled to their holders in other ways. The connectors are used to fluidly couple server 502 to fluid supply and/or fluid return connectors outside the server, for instance rack fluid fittings in an IT rack in which server 502 is housed (see, e.g., FIG. 1). As their names imply, supply connector 508s is a connector through which cooling fluid is supplied to the server, while return connector 508r is a connector through which cooling fluid leaves the server. For clarity, fluid connections between connectors 508s and 508r and other liquid-cooling components within server 502 are not shown, but typically there will be fluid connections between connectors 508s and 508r and liquid-cooled heat-generating components in the server that are being cooled by the cooling fluid entering or leaving the server through connectors 508s and 508r.

Both holders 506s and 506r can translate in at least two directions (left and right in the illustrated embodiment, as in system 200). Because connector 508s is coupled to holder 506s, motion of holder 506s results in a corresponding motion of connector 508s, and the same is true of holder 506r and connector 508r. In the illustrated embodiment, motion of holders 506s and 506r to the left extends their corresponding connectors 508s and 508r so that they engage with external fluid fittings, such as dripless blind-mating fittings. Similarly, motion of holders 506s and 506r to the right retracts their corresponding connectors 508s and 508r so that they disengage from external fluid fittings. An elastic member 510s biases supply holder 506s and connector 508s to their disengaged positions; similarly, an elastic member 510r biases return holder 506r and connector 508r to their disengaged positions. In the illustrated embodiment elastic members 510s and 510r are linear springs, but in other embodiments other kinds of elastic members can be used.

A switching unit 514 is used to move holders 506s and 506r back and forth between their engaged and disengaged positions. Switching unit 514 includes an electric motor M coupled to a power source such as a DC source/switch 216 by a pair of electrical lines 518+ and 518−, and the DC source/switch can be communicatively coupled to a leak detection sensor S. A pair of sector-shaped blades 520, including a supply blade 520s and a return blade 520r, are both coupled to motor M and each is coupled to an elastic member 521, as shown in FIG. 5A for switching unit 214. In one embodiment, both supply blade 520s and return blade 520r can be coupled to the same motor M but be coupled to different elastic members. In other embodiments, both blades can be coupled to the same motor M and the same elastic member, or can be coupled to different motors M and different elastic members.

Blades 520s and 520r can rotate in both directions about an axis of motor M, as indicated by the double-did circular arrow: as in switching unit 214, motor M rotates blades 520s and 520r at the same angular velocity in one direction over an angular range (i.e., a range of angles) while elastic members 521 rotate both blades at the same angular velocity in the other direction over the angular range. In the illustrated embodiment, motor M rotates blades 520s and 520r counterclockwise and the elastic member rotates the blades clockwise, but other embodiments the rotation directions can be different. In one embodiment, the 520r and 520s have different arc lengths but are designed as a single unit.

Supply blade 520s has a blade angle θs and a contact surface 522s that will be in contact with a bearing surface 512s in a first subrange of angular positions of the blades and will not be in contact with bearing surface 512s in a second subrange. Similarly, return blade 520r has a blade angle θr and a contact surface 522r that will be in contact with bearing surface 512r in a third subrange of angular positions of the blades and will not be in contact with bearing surface 512r in a fourth subrange of angular positions. In the illustrated embodiment return blade 520r has a larger blade angle θ than supply blade 520s (i.e., θr>θs), meaning that contact surface 522r is longer than contact surface 522s. The sizes of the first and third subranges depend on the blade angle, so the result of the larger blade angle of the return blade is that the size of the third subrange will be larger than the size of the first subrange. In embodiments where the first and third subranges vary in size, in some embodiments the first subrange can be a subset of the third subrange, and in other embodiments the first subrange can overlap with the third subrange.

As in fluid connection module 204, if contact surfaces 522s or 522r are in contact with their corresponding bearing surface 512, the corresponding holder 506s or 506r will be pushed against elastic members 210 into their engaged positions, and if contact surface 522s or 522r are not in contact with their corresponding bearing surface 512, the corresponding holder 506 will be pushed by elastic members 510 to its disengaged position. Put differently, when return blade 520r is positioned so that the radius associated with corner "a" is oriented horizontally as shown in the figure, contact surface 522r is in contact with bearing surface 512r and holder 506r is in its engaged position. As blade 520r rotates clockwise, contact surface 522r remains in contact with bearing surface 512r until surface 522r and corner "b" are positioned at the bearing surface—i.e., when the radius associated with corner "b" of blade 520r is horizontal in the figure. As blade 520r continues to rotate clockwise, the radius associated with corner "b" passes the point where it is horizontal in the figure, and holder 506r and connector 508r start to disengage, and the holder and connector disengage further as blade 520r continues to rotate clockwise. Note that bearing surface 212 and corner "b" can remain in contact with each other while the connectors are disengaged. Supply blade 520s operates similarly.

Figure 6A:
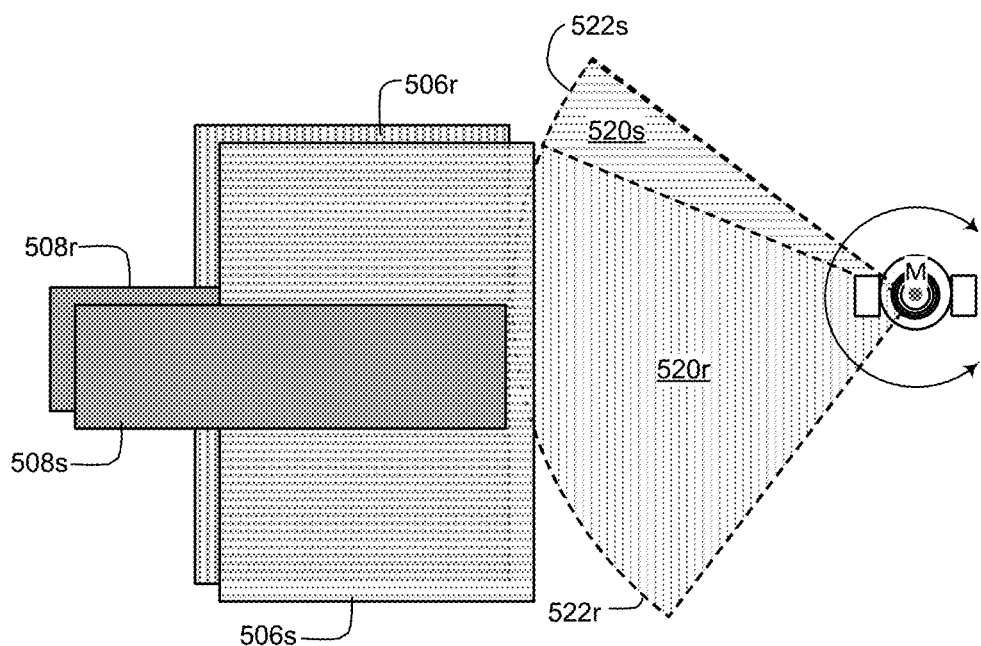
FIGS. 6A-6C are side views of the embodiment of the multi-blade fluid switching unit of FIGS. 5A-5B, illustrating an embodiment of the operation of the multi-blade switching unit.
Figure 6B:
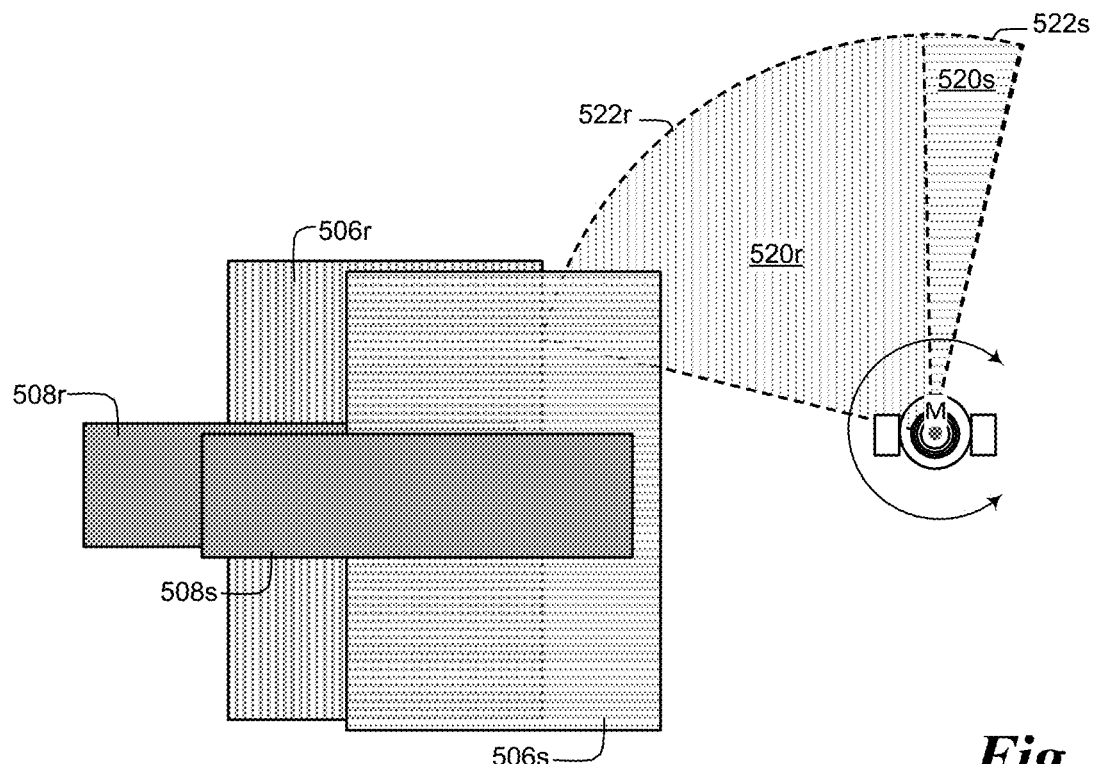
Figure 6C:
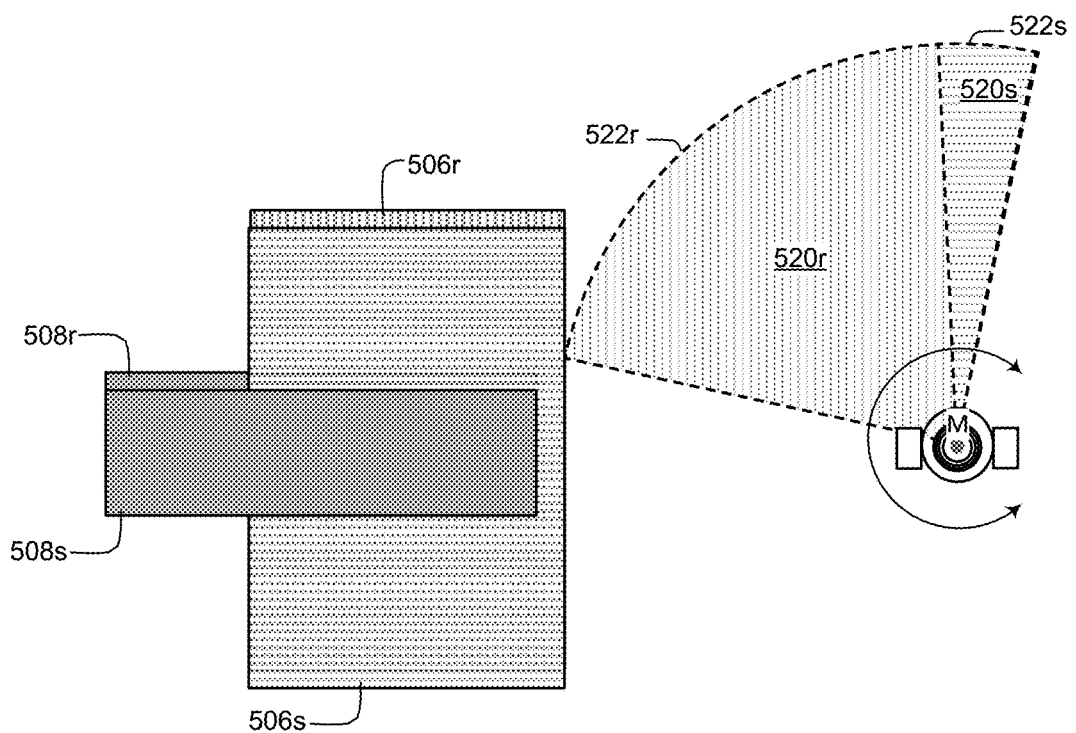

FIGS. 6A-6C together illustrate an embodiment of the operation of a multi-blade fluid connection module such as fluid connection module 504 shown in FIGS. 5A-5B. The sequence from FIG. 6A to FIG. 6C shows an operation that disengages the supply and return connectors. The reverse sequence, from FIG. 6C to FIG. 6A, shows an operation that engages the supply and return connectors.

Fluid connection module 504 starts with its supply and return blades in the positions shown in FIGS. 5A-5B, with contact surface 522s in contact with bearing surface 512s and contact surface 522r in contact with bearing surface 512r. With the blades in this position, holders 506s and 506r, and their corresponding connectors 508s and 508r, are in their engaged position.

As shown in FIG. 6A, if power is cut off to electric motor M—for instance because the DC power source fails, or because the switch is opened upon detection of a leak by sensor S—elastic members 521s and 521r (shown in FIG. 5A) begin to rotate blades 520s and 520r clockwise. As the blades rotate clockwise, supply blade 502s, because its contact surface 522s has a shorter arc length, will be the first to reach the angular position where contact surface 522s loses contact with bearing surface 512s. When that happens blade 520s no longer supplies a force to overcome the biasing force of elastic members 510s (not shown in FIGS. 6A-6C, but see FIGS. 5A-5B), so that elastic members 510s push holder 506s to the right, disconnecting and stopping flow through supply connector 508s. As this angular position contact surface 522r, because of its greater arc length, remains in contact with bearing surface 512r, so that at this stage of the process return connector 508r remains engaged but supply connector 508s is disengaged.

FIG. 6B shows a subsequent state of the system. After the state shown in FIG. 6A, supply holder 506s and supply connector 508s have moved to their fully retracted (i.e., rightmost) position. Elastic members 521s and 521r continue to rotate both blades 520s and 520r, so that supply blade 520s is now clear its corresponding holder but contact surface 522r has just begun to lose contact with bearing surface 512r. In the state illustrated in FIG. 6B, then, supply connector 508s is fully disengaged while return holder 506r and return connector 508r are just disengaging but still moving rightward. This time difference between disengagement of supply connector 508s and return connector 508r allows fluid to drain from the liquid cooling system.

FIG. 6C shows a subsequent state of the system. As elastic members 521s and 521r continue to rotate both blades 520s and 520r, contact surface 522r eventually loses contact with bearing surface 512r. At that point blade 520r no longer exerts a force on holder 206r that overcomes the force exerted by elastic members 510r, so that elastic members 510r push holder 210 from its engaged position to its disengaged positioning, thus cutting off fluid flowing through connector 208r. In the state illustrated in FIG. 6C, then, both supply connector 508s and return connector 508r are fully disengaged, so that no fluid can flow in or out of the system.

When power is applied or restored to motor M, the opposite sequence occurs—i.e., the blade moves from the state shown in FIG. 6C to the state shown in FIG. 6A, and finally to the state shown in FIGS. 5A-5B.

Figure 7:
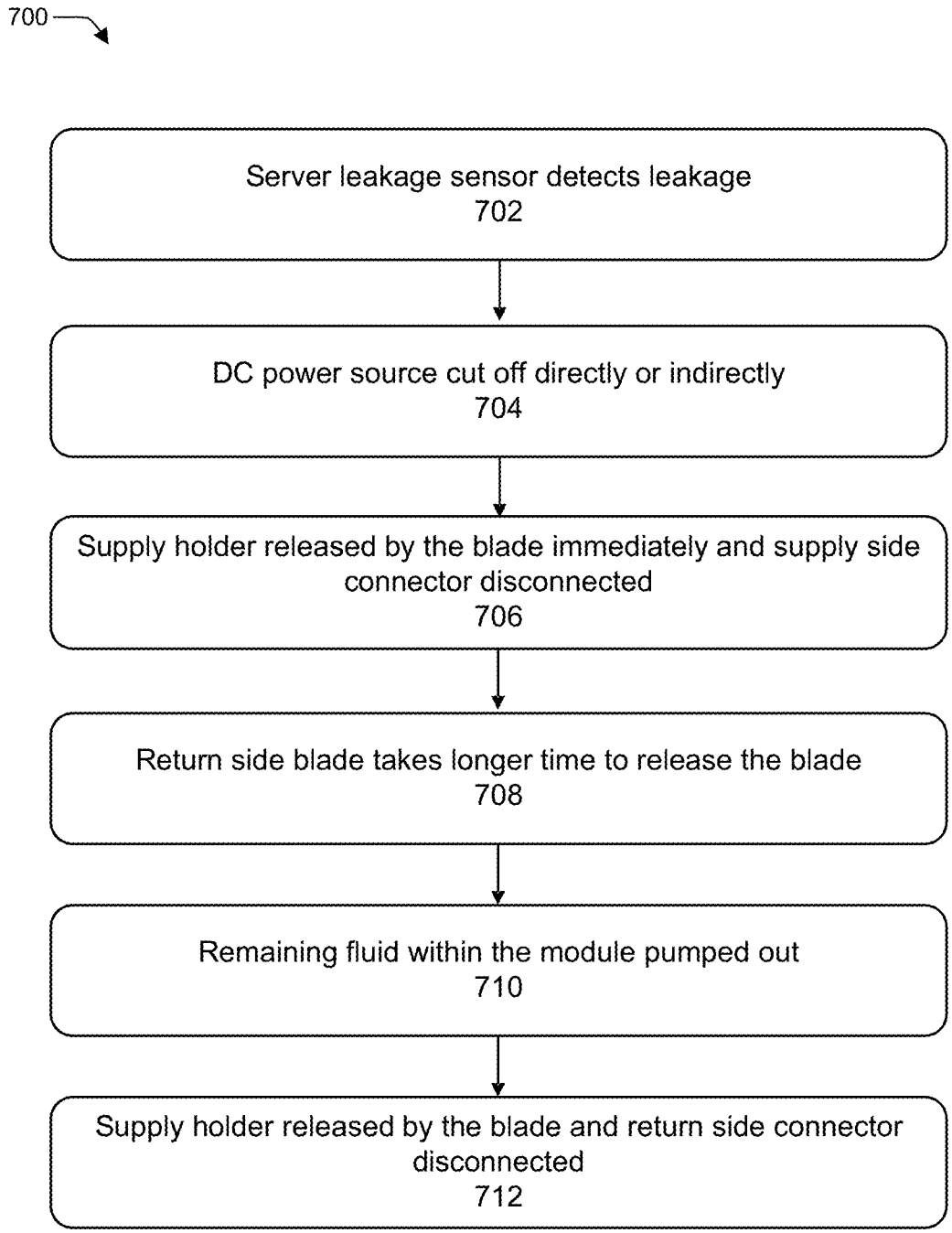
FIG. 7 is a flowchart of an embodiment of process for operating the multi-blade fluid connection module of FIGS. 5A-5B.

FIG. 7 illustrates, in flowchart form, an embodiment of the operation of fluid connection module 505, as illustrated in FIGS. 5A-5B and 6A-6C. The process begins at block 702 when a leak-detection sensor, such as sensor S shown in FIG. 2A-2B, detects a leak somewhere in the server. Detection of a leak means that electrical power to the server and fluid flow through the cooling system must be stopped to minimize damage from the leaking fluid. At block 704, DC power to motor M is cut off in response to detection of a leak. With power to the motor cut off, the motor no longer provides a torque to overcome the torque exerted by the elastic members 521s and 521r, so that the elastic members begin to rotate the blades.

At block 706, as the elastic members rotate both the supply and return blades, the supply blade, which has a shorter arc length, is the first to have its contact surface lose contact with the bearing surface of the supply holder. When the supply blade's contact surface loses contact with the holder, the holder begins to slide, disconnecting the supply connector. In the meantime, at block 708 the elastic member keeps turning both blades but the return blade, which has a longer arc length, remains in contact with the bearing surface of the return holder. At block 710, then, the fluid supply is cut off (i.e., disengaged) but the return is not. This is desirable, because it stops more fluid from entering the system while emptying fluid already in the system; among other things, this reduces the amount of fluid that can leak and damage the system.

Eventually, as the elastic members keep rotating both blades, at block 712 the return blade loses contact with the bearing surface of the return holder and the return holder begins to slide, disconnecting the return connector. At this stage, the cooling system is no longer fluidly connected to the rack supply and rack return.

Other embodiments are possible besides the ones described above. For instance:

The design of the switch hardware can be different.
The solution may need minor modifications for different systems.
The active position and idle position can be designed differently.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
a holder coupled to a connector having an axis; and
a switching unit adjacent to the holder, the switching unit comprising:
    an electric motor,
    a blade coupled to the electric motor and rotatable by the electric motor through a range of angular positions, the blade including a contact surface that contacts a bearing surface of the holder in a first subrange of the range of angular positions and stops contacting the bearing surface in a second subrange of the range of angular positions, wherein when the contact surface is in contact with the bearing surface, the holder is forced into its engaged position, and
    an elastic torque member coupled to the electric motor and to the blade, wherein the elastic torque member biases the blade to an angular position in the second subrange of the range of angular positions.

2. The apparatus of claim 1 wherein the holder is translatable in both directions of the axis so that the holder and the connector can translate between an engaged position and a disengaged position, and wherein the holder is biased toward the disengaged position, and wherein the holder is biased toward the disengaged position by an elastic member.

3. The apparatus of claim 2 wherein the elastic member comprises one or more linear springs.

4. The apparatus of claim 1 wherein the blade is a sector-shaped blade comprising:
a curved contact surface;
a first radial edge extending from one end of the curved contact surface to a blade apex; and
a second radial edge extending from another end of the curved contact surface to the blade apex, wherein the first radial edge and the second radial edge form a blade angle at the apex, the blade angle being the angle between the first radial edge and the second radial edge.

5. The apparatus of claim 4 wherein the electric motor is coupled to the blade at or near the blade apex.

6. The apparatus of claim 4 wherein a size of the first subrange and a size of the second subrange depend on the blade angle.

7. The apparatus of claim 1 wherein:
when the electric motor is supplied with electrical power, the electric motor rotates the blade to an angular position in the first subrange; and
when the electric motor is not supplied with electrical power, the elastic torque member rotates the blade to an angular position in the second subrange.

8. The apparatus of claim 1, further comprising:
a power source coupled to the electric motor, the power source including a switch to enable or disable power delivery by the power source; and
a leak-detection sensor coupled to the switch, wherein upon detection of a leak the leak-detection sensor opens the switch, disabling power delivery by the power source.

9. A system comprising:
a supply holder coupled to a fluid supply connector having an axis;
a return holder coupled to a fluid return connector having an axis;
a switching unit adjacent to the supply holder and the return holder, the switching unit comprising:
    an electric motor,
    a supply blade coupled to the electric motor and rotatable by the electric motor through a range of angular positions, the supply blade including a contact surface that contacts a bearing surface of the supply holder in a first subrange of the range of angular positions and stops contacting the bearing surface of the supply holder in a second subrange of the range of angular positions, wherein when the contact surface of the supply blade is in contact with the bearing surface of the supply holder, the supply holder is forced into its engaged position,
    a return blade coupled to the electric motor and rotatable by the electric motor through the range of angular positions, the return blade including a contact surface that contacts a bearing surface of the return holder in a third subrange of the range of angular positions and stops contacting the bearing surface of the return holder in a fourth subrange of the range of angular positions, wherein when the contact surface of the return blade is in contact with the bearing surface of the return holder, the return holder is forced into its engaged position,
    an elastic torque member coupled to the electric motor, the supply blade, and the return blade, wherein the elastic torque member biases the supply blade to an angular position in the second subrange of the range of angular positions and biases the return blade to an angular position in the fourth subrange of the range of angular positions.

10. The system of claim 9 wherein:
the supply holder is translatable in both directions of the axis so that the supply holder and the supply connector can translate between an engaged position and a disengaged position, and wherein the supply holder is biased toward the disengaged position, and
the return holder is translatable in both directions of the axis so that the return holder and the return connector can translate between an engaged position and a disengaged position, and wherein the return holder is biased toward the disengaged position.

11. The system of claim 10 wherein the supply holder and the return holder are biased toward their disengaged positions by elastic members, and wherein the elastic members comprise one or more linear springs.

12. The system of claim 11 wherein the first subrange is different than the third subrange of the range of angular positions.

13. The system of claim 12 wherein the first subrange is a subset of the third subrange.

14. The system of claim 12 wherein the first subrange overlaps with the third subrange.

15. The system of claim 9 wherein the supply blade and the return blades are sector-shaped blades comprising:
a curved contact surface;
a first radial edge extending from one end of the curved contact surface to a blade apex; and
a second radial edge extending from another end of the curved contact surface to the blade apex, wherein the first radial edge and the second radial edge form a blade angle at the apex, the blade angle being the angle between the first radial edge and the second radial edge.

16. The system of claim 15 wherein the electric motor is coupled to the blade at or near the blade apex.

17. The system of claim 15 wherein the blade angle of the return blade is greater than the blade angle of the supply blade.

18. The system of claim 17 wherein a size of the first subrange and a size of the third subrange depend on the blade angle.

19. The system of claim 9 wherein:
when the electric motor is supplied with electrical power, the electric motor rotates the supply blade to an angular position in the first subrange and rotates the return blade to an angular position in the third subrange; and
when the electric motor is not supplied with electrical power, the elastic torque member rotates the supply blade to an angular position in the second subrange and rotates the return blade to an angular position in the fourth subrange.

20. The system of claim 9, further comprising:
a power source coupled to the electric motor, the power source including a switch to enable or disable power delivery to the electric motor by the power source; and
a leak-detection sensor coupled to the switch, wherein upon detection of a leak the leak-detection sensor opens the switch, disabling power delivery to the electric motor by the power source.

* * * * *